United States Patent [19]
Annavarapu

[11] Patent Number: 6,045,634
[45] Date of Patent: Apr. 4, 2000

[54] HIGH PURITY TITANIUM SPUTTERING TARGET AND METHOD OF MAKING

[75] Inventor: Suresh Annavarapu, Edgewater, N.J.

[73] Assignee: Praxair S. T. Technology, Inc., North Haven, Conn.

[21] Appl. No.: 08/911,539

[22] Filed: Aug. 14, 1997

[51] Int. Cl.$^7$ .................................................. C22F 1/18
[52] U.S. Cl. ............................................................ 148/671
[58] Field of Search ................................... 148/669, 670, 148/671

[56] References Cited

U.S. PATENT DOCUMENTS

| | | |
|---|---|---|
| 4,619,695 | 10/1986 | Oikawa et al. . |
| 4,810,484 | 3/1989 | Uedaira et al. ......................... 423/598 |
| 5,087,297 | 2/1992 | Pouliquen . |
| 5,330,628 | 7/1994 | Demaray et al. . |
| 5,401,675 | 3/1995 | Lee et al. . |
| 5,449,641 | 9/1995 | Maeda ..................................... 437/195 |
| 5,455,197 | 10/1995 | Ghanbari et al. ....................... 437/192 |
| 5,529,670 | 6/1996 | Ryan et al. . |
| 5,581,125 | 12/1996 | Maeda ..................................... 257/767 |
| 5,772,860 | 6/1998 | Sawada et al. ..................... 204/298.13 |
| 5,798,005 | 8/1998 | Murata et al. ........................... 148/421 |

OTHER PUBLICATIONS

Zhu et al., Deposition of Ti Films by Collimation Sputtering, Hosei Univ. report to Research Center of Ion Beam Techy. 1994 87–92.

Wickersham, Jr., Crystallographic Target Effects in Magnetron Sputtering, J. Va. Sci. Technol. A 5 (4), Jul./Aug. 1987 1755–1758.

Betz et al., Energy and Angular Distributions of Sputtered Particles, Intl. J of Mass Spectrometry and Ion Processes 140 (1994) 1–110.

Marx et al., The Effect of Titanium Target Grain Size on Sputtering Performance, Materials Research Corp. Advanced Materials Div. Technical Note No. 201 1993 1–21.

*Primary Examiner*—John Sheehan
*Attorney, Agent, or Firm*—Wood, Herron & Evans L.L.P.

[57] ABSTRACT

A high purity titanium polycrystalline target with uniform grain size and near ideal (103) crystallographic orientation and a method of making. Uniform grain size from 10 $\mu$m–500 $\mu$m is achieved by using a fine grain five inch diameter titanium billet produced by hot working an electron beam cast billet. Greater than 80% (103) crystallographic orientation is achieved while maintaining uniform and optimal grain size in the target. The result is a higher collimated deposition rate with increased efficiency of bottom coverage of vias and a highly (002) oriented titanium film.

22 Claims, No Drawings

HIGH PURITY TITANIUM SPUTTERING TARGET AND METHOD OF MAKING

FIELD OF THE INVENTION

This invention relates generally to sputtering targets in semiconductor devices, and more specifically to an oriented titanium sputtering target for improved sputtering and a method of making the improved target.

BACKGROUND OF THE INVENTION

In the formation of integrated circuits (IC), thin films containing metal and metalloid elements are often deposited upon the surface of a semiconductor substrate. Thin films provide conductive and ohmic contacts in the circuits and between the various devices of an IC. For example, a thin film of a desired metal might be applied to the exposed surface of a contact or via hole on a semiconductor substrate, with the film passing through the inculpative layers on the substrate to provide plugs of conductive material for the purpose of making interconnections across the insulating layers.

Titanium nitride (TiN) films are commonly used in semiconductor stacks as barrier layers between the substrate (silicon, silicon dioxide, or any insulator) and metal (aluminum wires, tungsten plugs or aluminum plugs). Similarly, titanium (Ti) films are used in semiconductor stacks as wetting layers between a silicon (Si) substrate and the barrier layer (TiN or tungsten (W)) and also to form Ti-silicide contacts for submicron drains and gates. Magnetron sputtering of titanium targets is widely used to deposit thin films of Ti and TiN onto flat and patterned substrates in the manufacture of integrated circuits.

The primary requirement for Ti or TiN films deposited on flat substrates (i.e. blanket deposition) is the thickness uniformity of the film across the eight inch diameter Si wafer substrate. Film uniformity is improved by maintaining a grain size less than 50 $\mu$m, by maintaining an optimal crystallographic orientation in the target, and by maintaining these two parameters consistent across the target diameter and thickness. On the other hand, the requirement for Ti or TiN films deposited on patterned substrates (into vias) is the percentage of the area covered by the film across the bottom surface of a via whose width may range from 0.25 $\mu$m to 2.0 $\mu$m. Bottom coverage is improved by eliminating sputtered atoms whose trajectories are not perpendicular to the bottom surface of the via, either by placing a collimator between the target and the substrate or by increasing the distance between the target and substrate.

Two problems arise in conventional Ti targets for blanket deposition—large grains and strong crystallographic orientation. A target with undesirably large grains or strong crystallographic orientation has undesirable effects on the sputter deposition rate and film uniformity. The large grains, ranging in size from 10 mm to 50 mm, form as a result of the high temperatures involved in the bulk manufacture of high purity Ti by electron-beam melting and casting of billets ranging from 12 inches to 30 inches in diameter. Grain refiners cannot be used since they contaminate the target and hence contaminate the deposited film, contaminate its electrical properties, and ultimately contaminate the semiconductor device itself. Consequently, conventional Ti sputtering targets have been fabricated by hot working, cold working, and heat treatment to have grain size less than 50 $\mu$m. The strong crystallographic orientation forms as a result of the choice of temperatures used in the above hot-working, cold-working and heat treatment. Hence, the fabrication process for conventional Ti targets is designed to yield a weak crystallographic orientation perpendicular to the sputtering direction, such as that listed below using the Miller Index for crystallographic orientation:

| (100) | (002)  | (101) | (102)  | (110) | (103)  | (112) |
|-------|--------|-------|--------|-------|--------|-------|
| <5%   | 10–25% | <10%  | 15–25% | <10%  | 40–60% | <10%  |

Thus, on the target sputter face, less than about 5% of the grains have the (100) crystallographic orientation, about 10% to about 25% of the grains have the (002) crystallographic orientation, less than about 10% of the grains have the (101) and (110) crystallographic orientation, about 15% to about 25% of the grains have the (102) crystallographic orientation, about 40% to about 60% of the grains have the (103) crystallographic orientation, and less than about 10% of the grains have the (112) crystallographic orientation. Such a target has a cosine angular distribution of sputtered atoms as a result of the summation of the anisotropic emissions from grains having different crystallographic orientations. It is known that the film uniformity of such a uniform fine grain and randomly oriented target is superior to a target with a strong crystallographic orientation.

Two problems arise when using conventional Ti target for via deposition by collimation or long-throw sputtering—reduced deposition rate and lower yields for submicron vias. Conventional Ti targets have cosine angular distribution so that only 10% of the sputtered atoms are emitted perpendicular to the via bottom surface and the remainder are intercepted by the collimator, thus reducing the sputtering deposition rate. It is known that a lower sputtering deposition rate produces a Ti film with a weak (002) orientation, which is not preferred since it deleteriously affects the crystallographic orientation of the subsequent aluminum layer. Therefore, a target with a strongly overcosine angular distribution of sputtered atoms would offer a higher percentage of sputtered neutrals perpendicular to the via bottom surface. This would result in improved film quality, i.e. strong (002) orientation, and improved target utilization, which would reduce cost of ownership. However, this must be coupled with uniform and fine grains in order to achieve the increase in deposition rate while maintaining uniformity of bottom coverage across the eight inch diameter Si wafer substrate.

It is known that the sputter deposition rate through a collimator is maximized if the target has a preferred (103) crystallographic orientation and the (002) orientation is controlled below a limiting value. Therefore, a titanium target with a near-ideal (103) crystallographic orientation provides a higher deposition rate than one with a low (103) or a high (002) or a random crystal orientation. This occurs because sputtering targets with greater than 80% of (103) crystallographic orientation have a strongly overcosine distribution. This in turn means that a higher percentage of sputtered atoms are emitted perpendicular to the substrate surface resulting in an increased transmission rate through a collimator. An additional benefit is improved efficiency of bottom coverage for narrower and deeper vias, such as vias that are 0.5 $\mu$m wide by 1 $\mu$m deep. Step coverage, defined as the ratio of film thickness at the bottom versus at the overhang, and bottom coverage, defined as the percentage of area covered by film, are improved by 100% to 500% when a strongly overcosine angular distribution of sputtered atoms is used.

Several other combinations have been tried to form an improved target or improved process for bottom coverage. For example, a polycrystalline sputtering target with a preferred (002) crystallographic orientation has been used. A single crystal target with any preferred orientation has also been used. Finally, ionization of the sputtered neutral atoms and orienting the depositing neutrals by the means of a magnetic field on the plasma between the target and the substrate has been used. These combinations are not satisfactory because of the tradeoff in sputter deposition rate and uniformity of bottom coverage across the substrate diameter. For example, when using a sputtering target with a preferred (002) crystallographic orientation, the Ti films deposited by collimation sputtering have a very low (002) crystallographic orientation, which is not preferred. Alternatively, using a single crystal sputtering target results in non-uniform deposition across the substrate diameter.

There is a need, then, to control a titanium sputter target's grain size, crystallographic orientation and composition in order to provide a higher sputter deposition rate while maintaining uniformity across the substrate diameter to yield increased efficiency of collimation sputtering and of bottom coverage of submicron vias.

SUMMARY OF THE INVENTION

To this end, and in accordance with the principles of the present invention, a sputter target with controlled grain size, film composition, and crystallographic orientation is provided. Such a sputter target provides a higher sputter deposition rate while maintaining uniformity across the substrate diameter. Specifically, a fine grain polycrystalline "oriented-target" high purity titanium sputtering target having a uniform target grain size with near ideal (103) crystallographic orientation is provided. More specifically, the uniform target grain size is in the range of about 10 μm to about 500 μm, preferably less than about 20 μm, while maintaining greater than 80% (103) orientation.

This invention further provides a method of making a sputtering target by subjecting a titanium billet to a controlled deformation and a heat treatment to obtain a fine grain titanium body, then forging the body to form a pancake, cold working the pancake, and heat treating the pancake. A fine grain five inch diameter titanium billet produced by hot-working of an electron-beam cast billet may be used as a starting material.

According to the principles of the present invention, a sputtering target of high purity titanium having a uniform grain size and near ideal (103) crystallographic orientation, and a method of making such a target, is disclosed.

By virtue of the foregoing, there is thus provided an oriented titanium sputtering target for improved sputtering and a method of making the same. These and other objects and advantages of the present invention shall be made apparent from the accompanying description thereof.

DETAILED DESCRIPTION

A titanium billet, formed when a titanium ingot is heated, rolled and is cast into a mold to form a round, square, or rectangular shaped billet, is used as a starting material. Preferably the billet is a fine grain titanium billet having a diameter of about two inches to about twelve inches. A fine grain billet as used herein is a billet having a grain size less than about 500 μm, preferably in the range of about 10 μm to about 500 μm, and most preferably less than about 20 μm. The fine grain billet is preferably produced by forging or hot working an electron beam cast billet to heat the titanium metal to greater than one-third its melting temperature ($T_m$). While an electron beam melting and casting method of forming the billet is preferred when trying to achieve a high purity titanium sputter target, alternate methods of fabricating a billet from an ingot are possible. Such alternate methods include vacuum arc remelting (VAR), vacuum induction melting (VIM), hot isostatic pressing, cold isostatic pressing and sintering, plasma art melting, plasma spray deposition, Osprey™ spray deposition, and liquid dynamic compaction, or other methods known to one skilled in the art.

In still another embodiment, a coarse grain or large grain billet may be used as the starting material. A large grain billet is converted to a fine grain billet, for example, a large grain billet is converted to a fine grain five inch diameter billet by hot deformation. This conversion occurs by forging to reduce by 50% the starting size diameter to the final size diameter (that is, 2:1 forging) at temperatures ranging from about 700° C. to about 1350° C. and subsequent annealing and recrystallization. The annealing and recrystallization heats and softens the material and returns it to a uniform crystal structure.

The starting billet may be fabricated from powder via hot powder consolidation methods. Such methods include hot isostatic pressing, vacuum hot pressing, or hot extrusion. Hot isostatic pressing as used herein refers to heating the billet to a temperature about 0.5 to 0.8 of the melting temperature ($T_m$) for titanium and simultaneously pressing in all directions. Vacuum hot pressing as used herein refers to pressing in one direction only, usually from the top down, a powder into a particular form, and heating to a temperature about 0.5 to 0.8 of the melting temperature $T_m$) for titanium. The pressing step may be performed before the heating step, or the pressing and heating steps may occur simultaneously. Hot extrusion is defined as heating the billet to a temperature about 0.5 to 0.8 of the melting temperature $T_m$) for titanium and squeezing through a dye or narrow hole to indirectly apply pressure.

In still another embodiment, the starting billet is an electron beam cast billet which has been subjected to a deformation practice other than hot working or forging. For example, depending upon the size of the starting ingot, less deformation may be applied. As another example, different percentage reductions in size may be achieved and/or different temperatures may be used. The titanium billet that is used as a starting material, however, must have the following crystallographic orientation of grains (measured perpendicular to the surface of the billet end):

| (100) | (002) | (101) | (102) | (110) | (103) | (112) |
| --- | --- | --- | --- | --- | --- | --- |
| 0–25% | <5% | 15–20% | <10% | 20–70% | <5% | 5–30% |

The starting billet size preferably has a diameter in the range of about two inches to about twelve inches, but may be of a different size as long as the starting crystallographic orientation and grain is as specified.

To achieve the preferred greater than 80% (103) crystallographic orientation as defined using the Miller Index for crystallographic orientation as described in "Elements of X-Ray Diffraction," B. D. Cullity, Addison-Wesley Publishers, Reading Mass., 1956, pp. 32–78 and known to one skilled in the art, a combination of controlled deformation and heat treatment of a fine grain titanium body is used. In one embodiment, controlled deformation and heat treatment is performed in a two step process. The first step involves hot forging at a temperature in the range from about 600° C. to about 1100° C., to a true strain (defined as the natural log of the initial height divided by the final height, in "Mechanical Behavior," W. Hayden, W. G. Moffatt & J. Wulff, John Wiley & Sons, New York, 1965, p.7) greater than four to form a pancake. The second step involves cold working the pancake to a true strain greater than four, then heat treating at a temperature in the range from about 575° C. to about 775° C. for a period of between about one hour and twenty-four hours, and preferably between about one and four hours, with the shorter times preferred to achieve fine grains.

As an alternative second step, deformation may be achieved by warm or hot rolling. Warm rolling occurs when the temperature is less than about 0.4 $T_m$ of titanium. Hot rolling occurs when the temperature is about 0.4 to 0.8 $T_m$ of titanium. Two rolls of a metal, from about one foot to several feet in diameter and about two to eight feet in width, are aligned so as to be parallel and with an adjustable gap between the rolls. By rolling, the gap is decreased to less than about one inch.

In other alternate embodiments, a smaller strain in the first step and a higher strain in the second step may be used, or a higher strain in the first step and a smaller strain in the second step may be used, as long as the same total strain is achieved. In yet another alternate embodiment, slightly lower strains in each of the two deformation steps may be used, such as strains from three to four rather than strains greater than four.

In still another embodiment, controlled deformation and heat treatment is performed in a one-step process. In the one-step process the rolling, forging, or extruding at a temperature ranging from 500° C. to 1100° C. is achieved by applying the full strain in a single step. In yet another embodiment, intermediate steps between each deformation step are added, in which annealing heat treatments are performed between the deformation steps.

EXAMPLE

A titanium forge billet five inches in diameter with a grain size of about 250 $\mu$m was cut into 2"×2"×2" cubes using a band saw. The five inch diameter titanium forge billet may be fabricated from either a 12 inch diameter to a 30 inch diameter electron beam cast billet, a vacuum arc remelting (VAR) ingot, or a powder metallurgy hot isostatic pressing (PM HIP) billet by hot deformation. The forging is done at temperatures ranging from about 700° C. to about 1350° C., with a preferred maximum temperature of about 900° C. The recrystallization treatment is preferable performed at a temperature between about 575° C. and about 775° C. The cubes were then heated in an oven to either 600° C., 850° C., or 1100° C. for three hours, and were hot forged in a hydraulic press from a thickness of 1.3 inches to a thickness of 0.325 inch, that is, a strain of four, with the diameter increasing from about 2 inches to about 4.5 inches. The 4.5 inches× 0.325 inch cylinders were then rolled to a thickness of 0.080 inch (which translates to a strain of 4.1) and a diameter of 9 inches, taking reductions of 0.20 inch to 0.25 inch per pass and rotating the blank through 90° after each pass. The rolled blanks were then placed in a heated oven at a temperature in the range of about 475° C. to about 875° C., preferably about 575° C., and recrystallized for four hours to yield a uniform grain size ranging from 10 $\mu$m to 250 $\mu$m. The crystallographic orientation of the recrystallized titanium body was measured by x-ray diffraction as known to one skilled in the art, described in "Elements of X-Ray Diffraction," B. D. Cullity, Addison-Wesley Publishers, Reading Mass., 1956, pp. 303–308, and quantified as the relative fraction of crystals on a sample surface (1 square inch) with a specific orientation in the sputtering direction. Greater than 80% (103) crystal orientation was achieved either by any of the conditions listed in sections 1 b, 2a, and 3b of the following table. The grain size, however, was maintained at 10 $\mu$m to 20 $\mu$m only under the conditions listed in section 2a of the following table:

| # | HP temp (° C.) | Strain imparted by Hot-Forging | Total Strain imparted by Cold Rolling | Recrystallization temp/ 4 h (° C.) | Grain Size ($\mu$m) | Orientation % (103) |
| --- | --- | --- | --- | --- | --- | --- |
| 1a | 600 | 4 | 4 | 475 | 10–20 | 55–71 |
| 1b | | | | 675 | 250 | 79–99 |
| 2a | 850 | 4 | 4 | 575 | 10–20 | 79–94 |
| 3a | 1100 | 4 | 4 | 475 | 10–20 | 56–62 |
| 3b | | | | 675 | 500 | 83–98 |
| 4a | 850 | 2 | 2 | 575 | 50 ± 15 | 45–50 |

While the present invention has been illustrated by a description of embodiments and an example, and while the illustrative embodiments and example have been described in considerable detail, it is not the intention of the inventor to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. For example, different directions of deformation may be used, such as deforming from the side rather than deforming from the top down. As another example, hammer forging may be used instead of hydraulic pressing. As still another example, different combinations of degrees of strain, such as hot working to a strain of 5 and cold working to a strain of 3, rather than hot working to a strain of 4 and cold working to a strain of 4, may be used as long as the desired total strain is achieved. Accordingly, departures may be made from such details without departing from the spirit or scope of applicant's general inventive concept.

Having described the invention, what is claimed is:

1. A method of making a titanium sputtering target comprising
    subjecting a titanium billet having the following crystollographic orientation of grains: 0–25% (100), <5% (002) 15–20% (101), <10% (102),20–70% (110), <5% (103) and 5–30% (112), to a controlled deformation and a heat treatment to obtain a fine grain titanium body;

hot forging said body to form a pancake;

cold working said pancake to form a blank; and heat treating said blank.

2. The method of claim 1 comprising using a coarse grain billet for said subjecting to a controlled deformation and a heat treatment step.

3. The method of claim 1 comprising using a fine grain billet for said subjecting to a controlled deformation and a heat treatment step.

4. The method of claim 3 comprising obtaining said fine grain billet from an electron beam cast billet by a deformation process.

5. The method of claim 4 comprising deforming said titanium billet by hot working.

6. The method of claim 3 comprising using said fine grain billet having a diameter of about five inches.

7. The method of claim 1 comprising using a billet for said subjecting to a controlled deformation and a heat treatment step that is fabricated from powder by a hot powder consolidation method.

8. The method of claim 7 wherein said hot powder consolidation method is selected from the group consisting of hot isostatic pressing, vacuum hot pressing, and hot extruding.

9. The method of claim 1 comprising using a one-step process for controlled deformation and heat treatment.

10. The method of claim 9 comprising deforming by a method selected from the group consisting of rolling, forging, and extruding at a temperature in the range from about 500° C. to about 1100C.

11. The method of claim 1 comprising using a two-step process for controlled deformation and heat treatment.

12. The method of claim 11 comprising deforming by rolling up to a temperature in the range from about 850° C. in the second step.

13. The method of claim 11 comprising using an intermediate annealing heat treatment step between a deformation step.

14. The method of claim 11 comprising using a smaller strain in a first step and a higher strain in a second step to achieve a desired total strain.

15. The method of claim 11 comprising using a higher strain in a first step and a smaller strain in a second step to achieve a desired total strain.

16. The method of claim 1 comprising hot forging at a temperature in the range of about 600° C. to about 1100° C.

17. The method of claim 16 comprising hot forging to a strain greater than about four.

18. The method of claim 16 comprising hot forging to a strain in a range of about three to about four.

19. The method of claim 1 comprising cold working to a strain greater than about four.

20. The method of claim 1 comprising heat treating said blank at a temperature in the range of about 575° C. to about 775° C.

21. The method of claim 20 comprising heat treating from about 1 to about 24 hours.

22. The method of claim 20 comprising heat treating from about 1 to about 4 hours.

* * * * *